US008153528B1

(12) United States Patent
Hendler et al.

(10) Patent No.: US 8,153,528 B1

(45) Date of Patent: Apr. 10, 2012

(54) SURFACE CHARACTERISTICS OF GRAPHITE AND GRAPHITE FOILS

(75) Inventors: Larry Hendler, San Jose, CA (US); Sharone Zehavi, San Jose, CA (US); Tanya Dulkin, San Jose, CA (US); Raanan Y. Zehavi, San Jose, CA (US)

(73) Assignee: Integrated Photovoltaic, Inc., San Jose, CA (US)

( * ) Notice: Subject to any disclaimer, the term of this patent is extended or adjusted under 35 U.S.C. 154(b) by 0 days.

(21) Appl. No.: 12/950,725

(22) Filed: Nov. 19, 2010

Related U.S. Application Data

(60) Provisional application No. 61/263,282, filed on Nov. 20, 2009.

(51) Int. Cl.
*H01L 21/00* (2006.01)

(52) U.S. Cl. ............. 438/697; 438/71; 438/692; 257/50

(58) Field of Classification Search .................... 438/71, 438/692, 697; 257/50
See application file for complete search history.

(56) References Cited

U.S. PATENT DOCUMENTS

| | | | | |
|---|---|---|---|---|
| 5,203,973 | A * | 4/1993 | Reith et al. | 205/159 |
| 5,206,183 | A * | 4/1993 | Dennison | 438/253 |
| 5,443,859 | A * | 8/1995 | Nagata | 427/122 |
| 6,184,138 | B1 * | 2/2001 | Ho et al. | 438/687 |
| 7,789,331 | B2 | 9/2010 | Zehavi | |
| 7,928,317 | B2 * | 4/2011 | Atanackovic | 136/252 |
| 2003/0234470 | A1 * | 12/2003 | Haan et al. | 264/293 |
| 2007/0254208 | A1 * | 11/2007 | Kurt et al. | 429/126 |
| 2008/0220558 | A1 | 9/2008 | Zehavi | |
| 2009/0038683 | A1 * | 2/2009 | Walter et al. | 136/263 |
| 2009/0085172 | A1 * | 4/2009 | Horigome et al. | 257/632 |
| 2009/0096364 | A1 * | 4/2009 | Fujii et al. | 313/504 |
| 2010/0237050 | A1 | 9/2010 | Zehavi | |
| 2010/0243963 | A1 | 9/2010 | Zehavi | |
| 2010/0304035 | A1 | 12/2010 | Zehavi | |
| 2011/0041903 | A1 | 2/2011 | Zehavi | |
| 2011/0045630 | A1 | 2/2011 | Zehavi | |

* cited by examiner

*Primary Examiner* — Jarrett Stark
*Assistant Examiner* — Nicholas Tobergte
(74) *Attorney, Agent, or Firm* — Fernandez & Associates, LLP

(57) ABSTRACT

The invention relates generally to preparation of a substrate for use in a photovoltaic device by application of a filling material and subsequent planarization of the top surface; optionally, a barrier layer is added.

17 Claims, 5 Drawing Sheets

Preparing a Surface 4000
Optional Steps
1 Selecting a substrate 4100
2 Selecting a filling material of preselected viscosity: 4200
organic polymer 4202
spin-on-glass 4204
inorganic material 4206
conductive additive 4208
3 Applying the filling material to the substrate; 4300
dispensing 4302
vapor deposition 4304
4 Achieving a planar surface 4400
spinning 4402
heating 4404
polishing 4406
chemical-mechanical polishing 4408
lapping 4410
squeezing 4412
5 graphitizing 4502
carburizing 4504
6 embossing 4602
texturing 4604
waffling 4606
7 barrier layer 4702

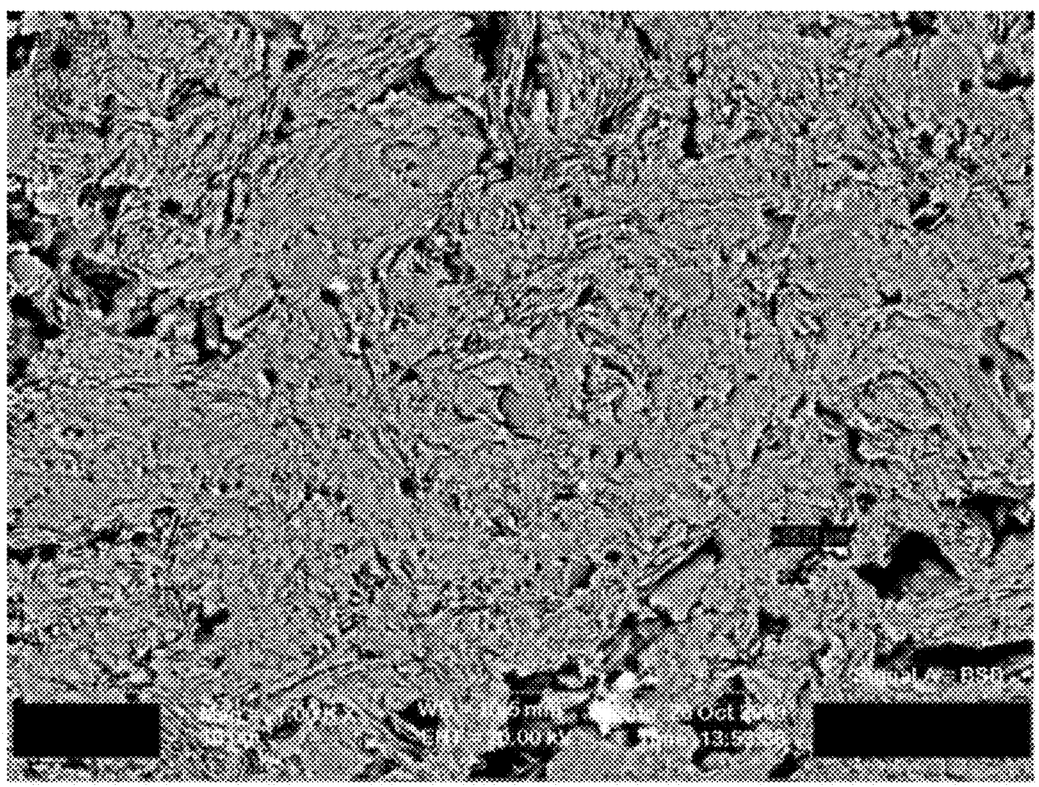
Figure 1 - bulk graphite surface under high magnification

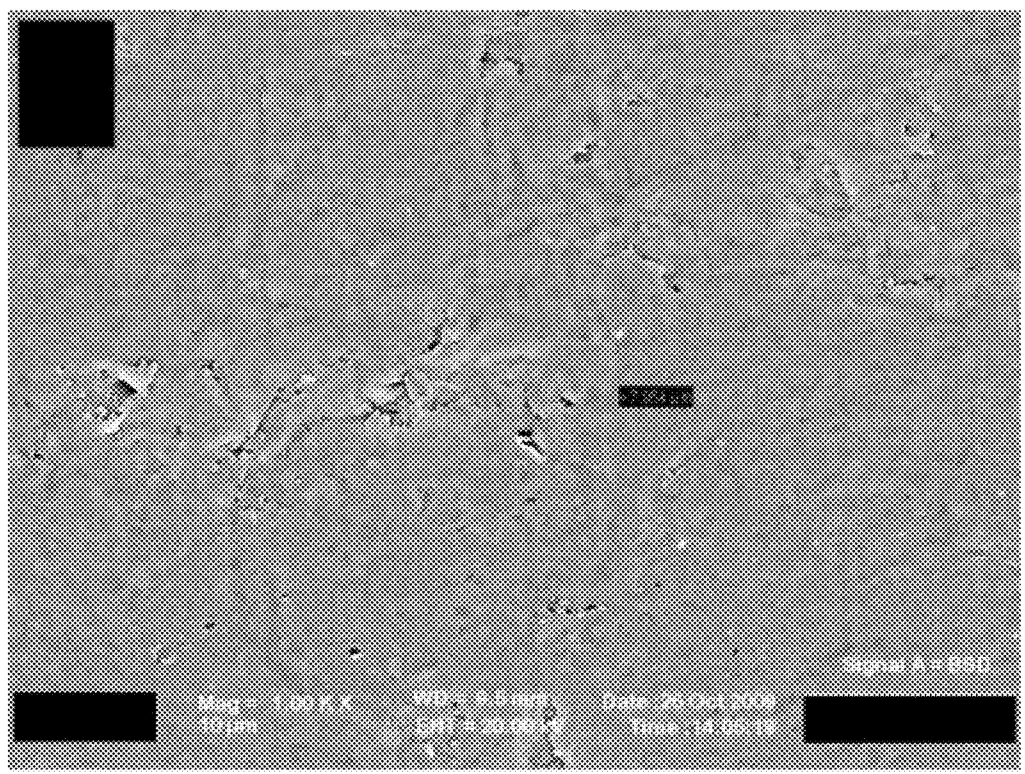
Figure 2 - Graphite foil surface under high magnification

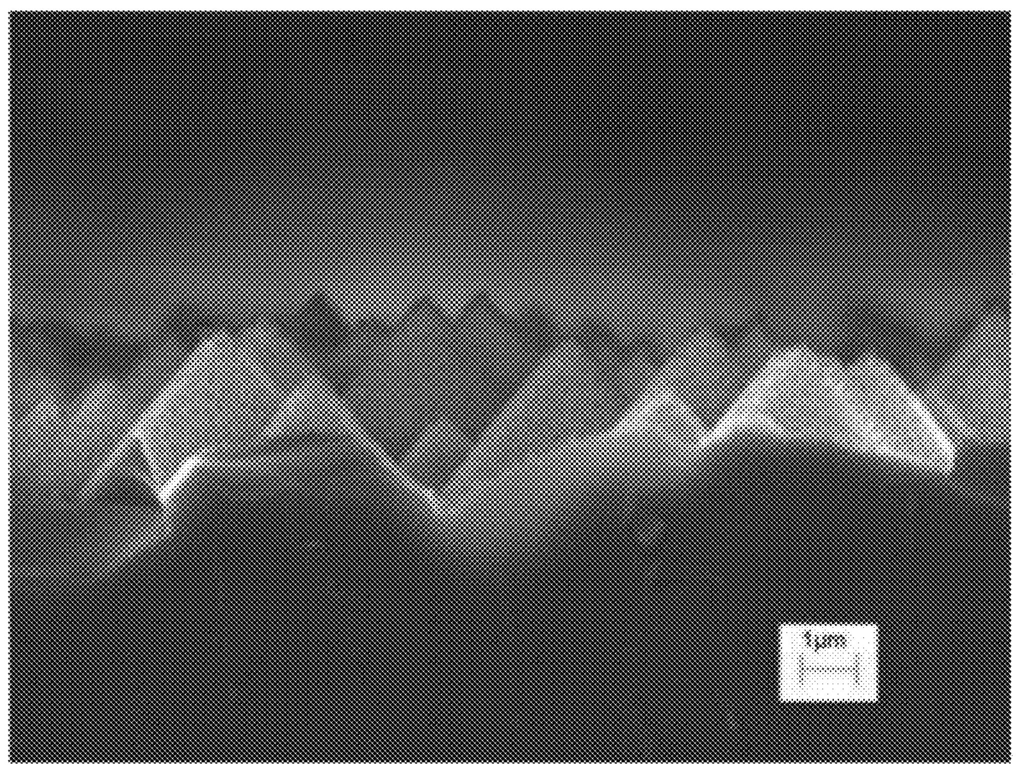
Figure 3 - silicon pyramids

Figure 4

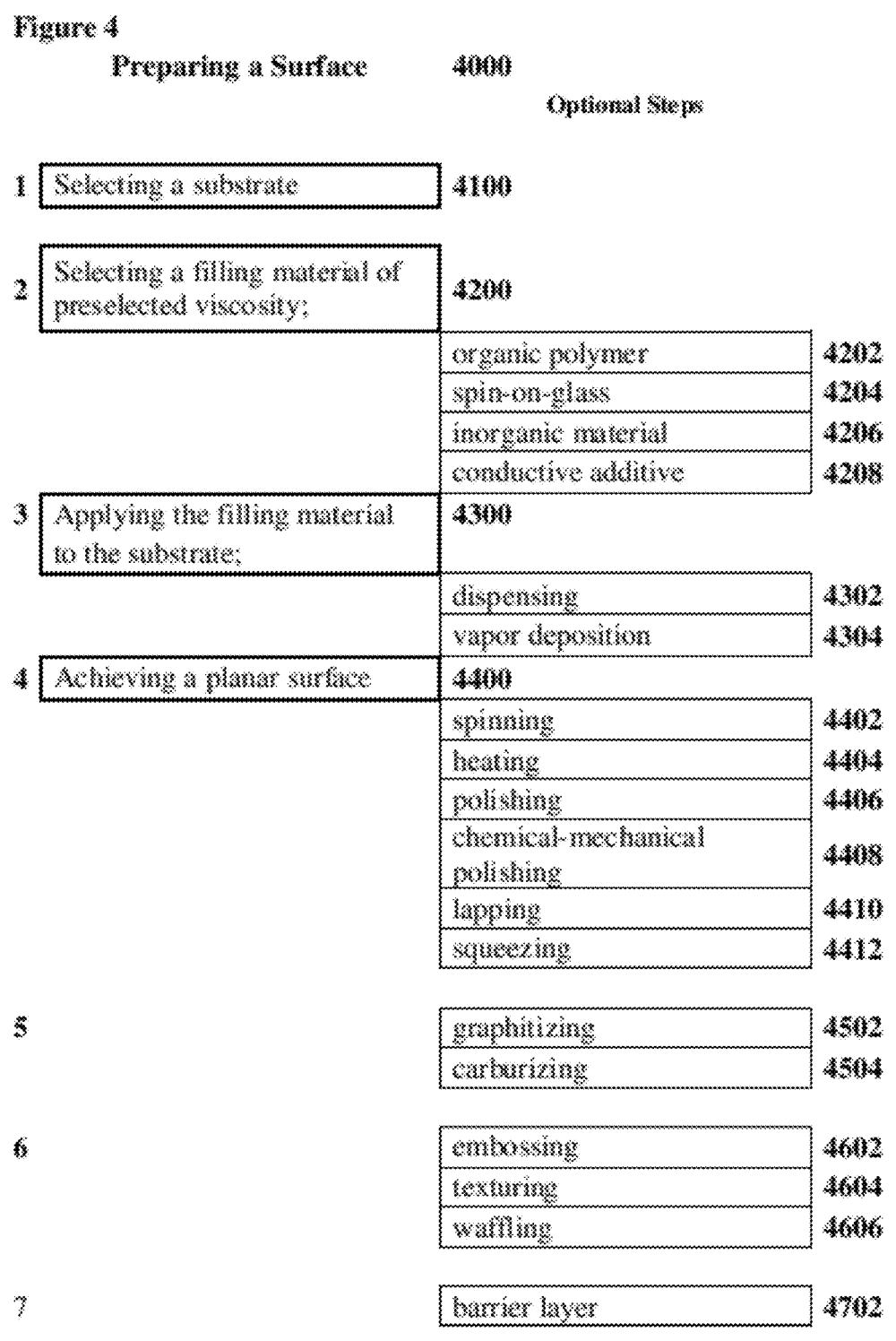

Preparing a Surface 4000

Optional Steps

| Step | Description | Ref. | Optional Step | Ref. |
|---|---|---|---|---|
| 1 | Selecting a substrate | 4100 | | |
| 2 | Selecting a filling material of preselected viscosity; | 4200 | | |
| | | | organic polymer | 4202 |
| | | | spin-on-glass | 4204 |
| | | | inorganic material | 4206 |
| | | | conductive additive | 4208 |
| 3 | Applying the filling material to the substrate; | 4300 | | |
| | | | dispensing | 4302 |
| | | | vapor deposition | 4304 |
| 4 | Achieving a planar surface | 4400 | | |
| | | | spinning | 4402 |
| | | | heating | 4404 |
| | | | polishing | 4406 |
| | | | chemical-mechanical polishing | 4408 |
| | | | lapping | 4410 |
| | | | squeezing | 4412 |
| 5 | | | graphitizing | 4502 |
| | | | carburizing | 4504 |
| 6 | | | embossing | 4602 |
| | | | texturing | 4604 |
| | | | waffling | 4606 |
| 7 | | | barrier layer | 4702 |

Figure 5A
4100
Figure 5B
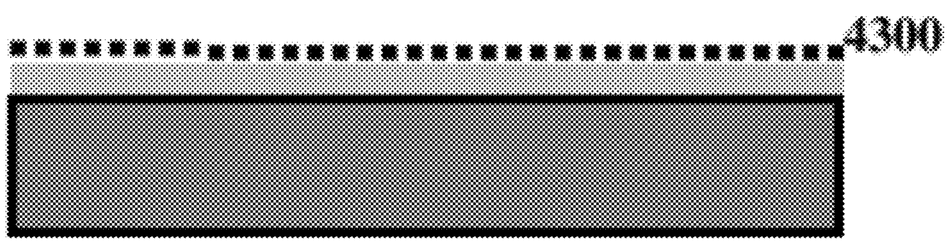
Figure 5C
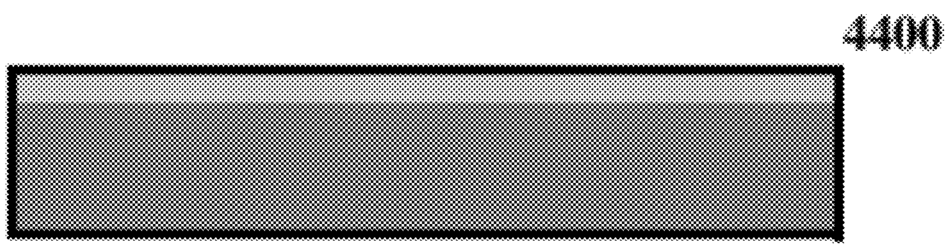
Figure 5D
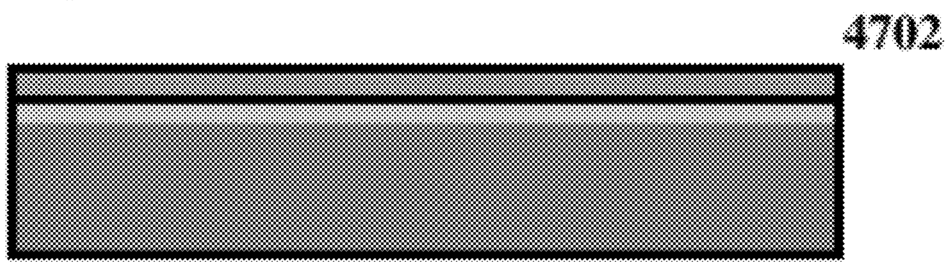

SURFACE CHARACTERISTICS OF GRAPHITE AND GRAPHITE FOILS

PRIORITY

This application claims priority from U.S. Provisional Applications 61/263,282 filed on Nov. 20, 2009.

CROSS-REFERENCE TO RELATED APPLICATIONS

This application is related in part to U.S. application Ser. Nos. 11/782,201, 12/074,651, 12/720,153, 12/749,160, 12/789,357, 12/860,048 and 12/860,088, all owned by the same assignee and incorporated by reference in their entirety herein. Additional technical explanation and background is cited in the referenced material.

BACKGROUND OF THE INVENTION

1. Field of the Invention

The invention relates generally to preparation of non-silicon substrates for use in a photovoltaic device.

2. Description of Related Art

It is known from the semiconductor industry that there are distinct process advantages to developing devices on highly planarized surfaces. In the semiconductor process, part of the fabrication process consists of generating images in a photoresist material as a precursor to either implant material or etch patterns into the previous layer. As the geometries of semiconductor devices shrink, the optics for imaging a layer becomes more complex and expensive. By planarizing layers, the requirements for depth of focus of the imaging optics are relaxed, making the process easier and less expensive to implement. Although in the photovoltaic industry imaging is less of a challenge than in the semiconductor industry, surface planarity provides a cost advantage in the arena of process control and material usage. By performing layer deposition on a planar surface it is easier to minimize the quantity of materials deposited to effectively create the next layer. This material cost reduction is significant in the operating margins of a manufacturing facility. With effective quality control there is less defective product, which also is advantageous to the operating margins of a manufacturing facility.

BRIEF SUMMARY OF THE INVENTION

The instant invention discloses novel surface planarization methods of a deposited layer or coating; optionally, lapping or chemical-mechanical polishing, CMP, process may also be used. A deposited layer may be formed by conventional means such as chemical vapor deposition, CVD, including hot wire CVD, physical vapor deposition, PVD, and variants such as LPCVD, ALD, PECVD, also included are plasma spray and molten liquid deposition. A coated layer may be an organic or polymer, including polyimides, epoxies, spin-on-glasses, SOG, and others known to one knowledgeable in the art In some embodiments an exemplary flow is given, FIG. 4:

1. Deposit layer or coating, 4300

Exemplary filling materials:

1.*a*. polyimide or epoxy layer, 4202

1.*b*. polyimide with conductive particle emulsion for conductive layer

1.*c*. spin-on-glass, 4204

1.*d*. a resin filling for planarizing a surface

1.*e*. silicon, in the form of molten silicon or silicon powder that is molten afterwards 1.*f*. any impregnation agent like all the materials mentioned above 1.*g*. Encapsulation of the substrate with a barrier layer (optional, can come before or after lapping)

2. Lapping (optional step), 4410

2.*a*. Mechanical abrasion

2.*b*. Chemical mechanical polish, 4408

BRIEF DESCRIPTION OF THE SEVERAL VIEWS OF THE DRAWING(S)

FIG. 1 SEM of bulk graphite surface.

FIG. 2 SEM of graphite foil surface.

FIG. 3 SEM of silicon pyramids.

FIG. 4 Exemplary process flow diagram

FIG. 5A Exemplary substrate; FIG. 5B, with filling material; FIG. 5C, planarized and FIG. 5D, added layer.

DETAILED DESCRIPTION OF THE INVENTION

The nature of substrates of carbon or graphite, as shown in the SEM images of FIGS. 1 and 2; a porous rough texture is obvious. Planarizing the carbon or graphite surface to reduce the surface roughness improves the interface and layer uniformity of a subsequently deposited thin film. Layer uniformity improves process control and device performance and lowers costs.

As shown in FIG. 1, a high resolution scanning electron microscope image, bulk carbon or graphite has a very porous surface, which means a very non-uniform interface with deposited layers of material. Since thin film depositions tend to follow the topology of the surface they are applied to, the deposited material will have a very non-uniform surface, propagating the uniformity problems to subsequent deposited layers. The object of the filling material is to create a smooth working surface on the substrate for subsequent layers. In some embodiments exemplary filling materials are organic polymers, including, polyimides, epoxies, resins, and spin-on-glasses; in some embodiments exemplary filling materials are molten silicon, or silicon powder that is subsequently melted, low-temperature glasses, low temperature melting metals. Exemplary substrates are carbon, and carbon based materials such as carbon tissue or carbon paper, graphite, graphite foils and graphene; the focus is on substrates for use with a photovoltaic device.

Conductivity of the filling material can be enhanced by adding a conductive powder of one or more materials such as carbon or ITO or silver or other conductor; powder size may be from micron to nm scale. Potential contamination issues from a planarized layer may be addressed with a subsequent barrier layer which will prevent migration of contaminants into an active layer such as for a photovoltaic device.

Graphite foil and carbon foil or tissues as a substrate for solar cell development displays a similar, although less severe issue of porosity. From the SEM image displayed in FIG. 2 (for graphite foil as example), we see that, besides the porosity, there is an obvious surface texture to the foil. The porosity and the surface texture can be eliminated by an appropriate planarizing layer. As discussed with bulk graphite, conductivity of the filling material can be enhanced by suspending conductive material into the coating layer.

A potential added advantage to planarizing methods is that after planarization, a surface embossing or waffling, as is commonly used in the manufacture of photovoltaic devices in order to trap light in the photo active layer, can be created by compression rolling a pattern onto the surface. The disclosed methodology is much simpler than the conventional method used to create waffling in silicon substrates by etching the surface in order to preferably display the silicon plane as pyramids, as noted in FIG. 3, an image taken from www-.sciencedaily.com.

In some embodiments a method of planarizing a surface of a graphite substrate comprises steps for filling and covering the surface with a material of adjustable chemical and mechanical properties upon said graphite surface that will flow into the pores while maintaining an excess on the surface; spinning the substrate in order to generate a uniform surface topography; heating the layer to a temperature level and for a time duration necessary to adjust the chemical and mechanical properties of the planarizing layer to the desired properties, or melting the material to be able to impregnate and or smooth; applying a lapping process for removing excess surface layer while maintaining the fill of the porous structure and planarizing the substrate surface Optionally, a preselected filling material is a polyimide or other non-conductive liquid material; optionally, the filling is mixed with conductive powder to create a conductive fill layer; optionally, a filling material is spin on glass; optionally, a filling material is any resin or epoxy compatible with graphite impregnation; optional steps comprise appropriate processes of carbonization and graphitization; optionally a lapping process is a chemical mechanical polish process. FIG. 4 shows various embodiments with optional steps designated on the right. Exemplary process flow 4000 comprises mandatory steps of selecting a substrate, 4100, selecting a filling material of preselected viscosity, 4200; optional, non-limiting, choices for a filling material are organic polymer, 4202, spin-on-glass 4204, inorganic material, 4206, conductive additive, 4208; mandatory step, applying the filling material to the substrate, 4300; optional, non-limiting, choices for an application method, dispensing, 4302, vapor deposition, 4304; mandatory step, achieving a planar surface, 4400; optional, non-limiting, choices for achieving a planar surface, spinning 4402, heating 4404, polishing 4406, chemical-mechanical polishing 4408, lapping 4410, squeezing 4412; optional, non-limiting, choices for post treatment are graphitizing 4502, carburizing, 4504, embossing 4602, texturing 4604, waffling 4606; and/or adding a barrier layer, 4702.

FIGS. 5A, B, C and D show an exemplary schematic structure as it progresses through a disclosed embodiment. FIG. 5A shows an exemplary selected carbonaceous substrate; FIG. 5B shows an exemplary substrate with applied filling material after step 4300; FIG. 5C shows an exemplary substrate with planarized surface after step 4400; FIG. 5D shows an exemplary substrate with planarized filling material and added barrier layer after step 4702;

As used herein carbonization and graphitization are terms for the conversion of an organic substance into carbon or graphite through pyrolysis above 500 or 600° C. in vacuum or inert or reducing atmosphere but without oxygen or an oxidizing gas being present. In this manner an organic filling material will fill voids and pore spaces during application to a carbon based material with voiding or porosity. Subsequent carbonization converts the organic polymer to a carbon based material and smoothes out the surface of a carbon based substrate. Multiple applications may be required in severe voiding cases. What is critical and distinguishing about the disclosed invention is that the planarized substrate with carbonized filled material can withstand temperatures above at least 1,000 to 1,500° C. including in the presence of molten silicon for brief periods without degradation of performance characteristics.

In some embodiments a method of planarizing a surface of a graphite substrate by filling and covering the surface by applying a thick, dense layer using CVD methods comprising steps such as: applying a chemical-mechanical polish for selective removal of the surface layer while maintaining the fill of the porous substrate and planarizing the coating layer on the substrate; optionally, a deposited layer is silicon carbide; optionally, a deposited layer is a conductive layer of doped silicon carbide; optionally, a deposited layer is pyrolitic carbon; optionally, a deposited layer is a material compatible with the construction of a photovoltaic cell; optionally, a surface texture or waffling of the planarized surface is formed by compressing the surface with a textured platen or roller. Optionally, a barrier layer or template layer is added over the planarized layer; a barrier and/or template layer may be TiN, TaN, $Si_3N_4$, $SiO_2$, $Si_xN_yO_z$, Si, Ge, $Si_xGe_y$ or other material known to one knowledgeable in the art.

In one embodiment a method of preparing a surface of a substrate comprises the steps:

selecting the substrate;

selecting a filling material of preselected viscosity;

applying the filling material such that the surface is covered; and planarizing the surface by one or more steps of spinning, heating and polishing; optionally, the method further comprising the step: planarizing the filling material by one or more steps of squeezing, lapping, or chemical-mechanical polishing; optionally, the filling material is a solid; optionally, further comprising the step of melting the solid filling material; optionally, the substrate is one of graphite, graphite foil, carbon, carbon foil, carbon tissue, graphene or flexible organic sheet; optionally, the filling material is a polyimide; optionally, the filling material comprises a conductive powder; optionally, the filling material is a spin-on-glass; optionally, the filling material is a polymeric organic; optionally, the filling material is a resin; optionally, the filling material is an epoxy; optionally, the filling material is an inorganic polymer; optionally, the filling material is silicon; optionally, the filling material is molten silicon, as from a plasma spray or liquid molten source; optionally, further comprising the steps of carbonizing the applied filling material before the planarizing such that the planarized surface is operable above 1000° C.; optionally, further comprising the step: generating a surface texture by embossing the surface with a textured platen or roller.

In one embodiment a method of preparing the surface of a substrate comprises the steps; overcoating the surface with a layer deposited by vapor deposition; polishing the deposited layer such that the deposited layer is planarized; optionally, the substrate is one of graphite, graphite foil, carbon, carbon foil, carbon tissue or flexible organic sheet optionally, the deposited layer is one or more of silicon carbide, silicon, TiC, TiN, BN, pyrolitic carbon and carbon; optionally, the deposited layer is conductive; optionally, further comprising the step of generating a surface texture by embossing the surface with a textured platen or roller.

In one embodiment a method of preparing a surface of a substrate comprises the steps: selecting the substrate; selecting a filling material of preselected viscosity; applying the filling material such that the surface is covered; carbonizing the filling material; and planarizing the surface such that the planarized surface is operable above 1000° C.; optionally, further comprising the step: generating a surface texture by embossing the surface with a textured platen or roller.

It will be understood that when an element as a layer, region or substrate is referred to as being "on" or "over" or "adjacent" another element, it can be directly on the other element or intervening elements may also be present. In contrast, when an element is referred to as being "directly on" or "directly over" or "in contact with" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The foregoing described embodiments of the invention are provided as illustrations and descriptions. They are not intended to limit the invention to a precise form as described. In particular, it is contemplated that functional implementation of invention described herein may be implemented equivalently in various combinations or other functional components or building blocks. Other variations and embodiments are possible in light of above teachings to one knowledgeable in the art of semiconductors, thin film deposition techniques, and materials; it is thus intended that the scope of invention not be limited by this Detailed Description, but rather by claims following.

We claim:

1. A method of preparing a surface of a carbonaceous substrate comprising the steps:

selecting the surface of the substrate;

selecting a filling material operable as a filling material above 1000° C.;

applying the filling material to the surface of the substrate such that the surface is covered;

carbonizing the applied filling material such that the surface is operable above 1000° C.; and planarizing the surface by one or more steps of spinning, heating and polishing.

2. The method of claim 1 further comprising the step:

planarizing the filling material by one or more steps of squeezing, lapping, or chemical-mechanical polishing.

3. The method of claim 1 wherein the filling material is a solid.

4. The method of claim 3 further comprising the step of melting the solid filling material.

5. The method of claim 1 wherein the substrate is one of graphite, graphite foil, carbon, carbon foil, carbon tissue, graphene or flexible organic sheet.

6. The method of claim 1 wherein the filling material is a polyimide.

7. The method of claim 1 wherein the filling material comprises a conductive powder.

8. The method of claim 1 wherein the filling material is a spin-on-glass.

9. The method of claim 1 wherein the filling material is a polymeric organic.

10. The method of claim 1 wherein the filling material is a resin.

11. The method of claim 1 wherein the filling material is an epoxy.

12. The method of claim 1 wherein the filling material is an inorganic polymer.

13. The method of claim 3 wherein the filling material is one of silicon, silicon from a plasma spray or molten silicon form a liquid source.

14. The method of claim 1 further comprising the step:

generating a surface texture by embossing the planarized surface with a textured platen or roller.

15. The method of claim 8 wherein the filling material is one or more of silicon carbide, silicon, TiC, TiN, BN, pyrolitic carbon and carbon.

16. A method of preparing a surface of a carbonaceous substrate comprising the steps:

selecting the surface of the substrate;

selecting a filling material operable as a filling material above 1000° C.;

applying the filling material such that the surface is covered;

carbonizing the filling material; and planarizing the surface such that the planarized surface is operable above 1000° C.

17. The method of claim 16 further comprising the step:

generating a surface texture by embossing the planarized surface with a textured platen or roller.

* * * * *